United States Patent [19]

Oliver

[11] Patent Number: 5,079,032
[45] Date of Patent: Jan. 7, 1992

[54] ION IMPLANTATION OF SPHERICAL SURFACES

[75] Inventor: Richard W. Oliver, Acton, Mass.
[73] Assignee: Spire Corporation, Bedford, Mass.
[21] Appl. No.: 558,084
[22] Filed: Jul. 25, 1990

Related U.S. Application Data

[62] Division of Ser. No. 383,927, Jul. 21, 1989, Pat. No. 4,968,006.

[51] Int. Cl.⁵ ............................................... B05D 3/06
[52] U.S. Cl. ........................................ 427/38; 427/47; 427/328; 427/347
[58] Field of Search ...................... 427/38, 47, 328, 347

[56] References Cited

U.S. PATENT DOCUMENTS

| | | | |
|---|---|---|---|
| 3,900,636 | 8/1975 | Curry et al. | 427/38 |
| 3,925,116 | 12/1975 | Engel | 148/143 |
| 4,212,690 | 7/1980 | Beuyukian et al. | 148/131 |
| 4,465,524 | 8/1984 | Dearnalay et al. | 148/31.5 |
| 4,490,190 | 12/1984 | Speri | 148/16.6 |
| 4,568,396 | 2/1986 | Vardiman | 148/133 |
| 4,669,416 | 6/1987 | Delgado et al. | 118/503 |
| 4,693,760 | 9/1987 | Sioshansi | 148/4 |
| 4,872,922 | 3/1989 | Bunker et al. | 148/4 |

FOREIGN PATENT DOCUMENTS

| | | | |
|---|---|---|---|
| 3439622 | 4/1986 | Fed. Rep. of Germany | 148/903 |
| 2154450 | 9/1985 | United Kingdom . | |

OTHER PUBLICATIONS

M. S. Dresselhaus et al., "Ion Implantation of Polymers," *Mat. Res. Synp. Proc.*, vol. 27 (1–1984), pp. 413–422.
W. C. Aver et al., "The Wear Behavior of Nitrogen Implanted Metals," *Metallurgical Transactions*, A15 (12–1984), pp. 2221–2229.
P. Sioshansi et al., "Wear Improv. of Surg Titanium Alloys by Ion Implant," *J. Vac. Sci. Tech.* A3(6), Nov./Dec. 1985, pp. 2670–2674.
J. M. Williams et al., "Improv. in Wear Perf. of Surg T1-6A1-4V Alloy . . . ," U.S. D. of Energy, (6–1985), pp. 1–10.
J. M. Williams et al., "Effect of N-Implant on Corrosive Wear Properties . . . ", *Mat. Res. Soc. Synp. Proc.*, vol. 27 (1–1984), pp. 735–740.
G. K. Wolf, "Ion Bombard. Chemistry," *Nucl. Instruments & Methods* 139 (1–1976); pp. 147–151.
P. Sioshansi, "Ion Beam Modif. of Materials for Industry," *Thin Solid Films*, 118 (1–1984), pp. 61–71.

*Primary Examiner*—Bernard Pianalto
*Attorney, Agent, or Firm*—Morse, Altman, Dacey & Benson

[57] ABSTRACT

An improved method and an apparatus for the ion implantation of spherical surfaces are disclosed. The method includes the provision of a revised fixture by which a plurality of spherical workpieces are presented to a large area ion beam in a way that their entire respective spherical surfaces are uniformly ion implanted to improve their surface characteristics. The fixture includes a disc mounted for motion about two axes normal to each other, a plurality of holes formed in a the disc loosely to accommodate therein a plurality of spherical workpieces, each of the plurality of holes formed with a spherical bottom and having a cleaning orifice, cooling means disposed on one side of the disc, a thermocouple operatively mounted in association with the disc, and a cover plate mounted on a second side of the disc and provided with a plurality of apertures concentric with the plurality of holes formed in the disc. The method includes randomization of the motion about one of the two axes of motion by interrupting this motion for about 15 to about 30 seconds once every 90 to about 120 seconds.

4 Claims, 3 Drawing Sheets

ION IMPLANTATION OF SPHERICAL SURFACES

This is a division of application Ser. No. 383,927, filed on July 21, 1989, now U.S. Pat. No. 4,968,006.

BACKGROUND OF THE INVENTION

1. Field of the Invention

The present invention relates generally to ion implantation and, more particularly, to an improved method and apparatus for the ion implantation of spherical surfaces over that disclosed and claimed in copending application of Stephen N. Bunker et al, Ser. No. 167,632, filed Mar. 11, 1988, Group 111, and assigned to a common assignee, Spire Corporation.

2. The Prior Art

Ion implantation is by now a well known method that was originally developed in the semiconductor industry to effect precise doping of silicon wafers with impurities. From there, the method spread to the ion implantation of metals and compounds, see *Treatise on Materials Science and Technology,* Vol. 18, "Ion Implantation," 1980, Academic Press, Inc. See also a recently issued U.S. Pat. No. 4,693,760, assigned to the common assignee herein, the Spire Corporation, and entitled "Ion Implantation of Titanium Workpieces Without Surface Discoloration." See further an article authored by M. S. Dresselhaus et al of M.I.T. "Ion Implantation of Polymers," *Mat. Res. Soc. Symp. Proc.,* Vol. 27 (1984), pp. 413-422, and another by G. K. Wolf, "Ion Bombardment Chemistry," *Nucl. Instrum. Methods* 139 (1976) 147. See also "Ion Beam Modification of Materials for Industry," *Thin Solid Films,* 118 (1984) 61-71; "The Wear Behavior or Nitrogen-Implanted Metals," *Metallurgical Transactions,* A 15 (1984), 2221-2229; and "Wear improvement of surgical titanium alloys by ion implantation; *J. Vac. Sci. Tech.* A3 (6) Nov./Dec. 1985, 2670-2674.

Some of the above mentioned work also involved the ion implantation of spherical surfaces as, for instance, the ball part 26 of a hip prosthesis 12 in the said U.S. Pat. No. 4,693,760. Inasmuch ion implantation is a line-of-sight process, spherical surfaces represent a geometry that is particularly difficult to ion implant, especially ion implant uniformly about its spherical surface. The uniform ion implantation of spherical surfaces, in particular when needing to process large quantities thereof, has thus presented special problems. The problem has been aggravated even more when wanting to ion implant spherical surfaces of different sizes and of different materials. These shortcomings have been addressed with some success in a copending application Ser. No. 167,632, filed Mar. 11, 1988, Group 111, of Stephen N. Bunker et al, Notice of Allowance mailed 5/10/89, and assigned to a common assignee, Spire Corporation of Bedford, Mass., the disclosure of which is incorporated herein by reference. There is still room for improvements, however.

SUMMARY OF THE INVENTION

It is a principal object of the present invention to overcome the above disadvantages by providing an improved process and an apparatus for the large scale uniform ion implantation of spherical surfaces of different sizes and materials.

More specifically, it is an object of the present invention to provide an improved process and an apparatus for the large scale ion implantation of spherical workpieces, of whatever sizes and materials, with substantially uniform ion doses and to substantially uniform depths throughout their respective spherical surfaces. The process includes the provision of a revised fixture with which a plurality of spherical workpieces are presented, with randomization, in a suitable work station of an ion beam implanter to a large area ion beam in a way that their entire respective spherical surfaces are uniformly ion implanted to improve their surface characteristics. The apparatus includes the revised fixture mounted for motion about two axes normal to one another in a specially adapted work station of an ion beam implanter, with the fixture comprising a member, one of the two axes of motion being concentric with the axis of the member and the motion thereabout being rotational, the other of the two axes being normal thereto and the motion thereabout being a rocking type of motion, a plurality of holes formed in one side of the member and designed to accommodate loosely therein the plurality of spherical workpieces, each of the plurality of holes is formed with a spherical bottom and provided with a cleaning orifice communicating with the second side of the member, means mounted on the member to continuously monitor its temperature, and a cover plate removably secured on the first side of the member and provided with a plurality of apertures concentric with the plurality of holes formed in the member. Preferably, both the fixture and the spherical workpieces are degaussed to remove any potential magnetization. Preferably, the randomization is effected every 90 to 120 seconds by interrupting the rocking motion for about 15 to about 30 seconds. Preferably, the rotational motion is about one rpm.

Other objects of the present invention will in part be obvious and will in part appear hereinafter.

The invention accordingly comprises the process and the apparatus of the present disclosure, its components, parts and their interrelationships, the scope of which will be indicated in the appended claims.

BRIEF DESCRIPTION OF THE DRAWINGS

For fuller understanding of the nature and objects of the present invention, reference is to be made to the following detailed description, which is to be taken in connection with the accompanying drawings, wherein.

DETAILED DESCRIPTION OF THE PREFERRED EMBODIMENTS

Figure 1:
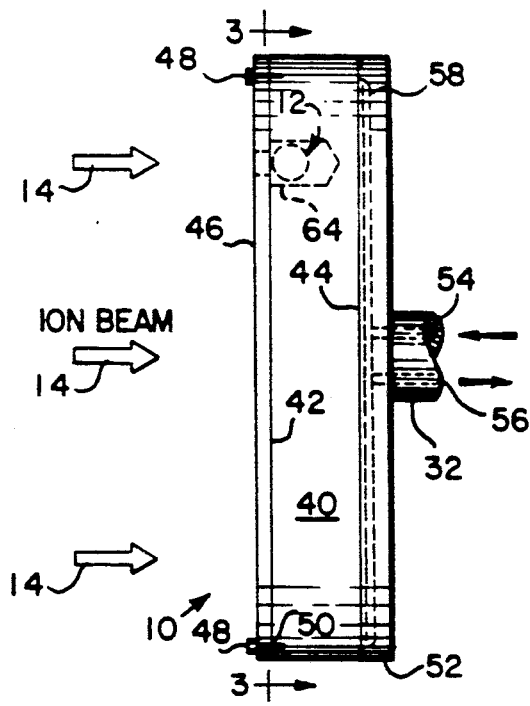
FIG. 1 is a schematic side view of a revised fixture designed to present a plurality of spherical workpieces to an ion beam according to the invention.

In general, the present invention pertains to an improved process and an apparatus for the ion implantation of spherical surfaces so as to enhance their surface characteristics.

As known, ion implantation is a line-of-sight process. Consequently, spherical surfaces define a geometry that is particularly difficult to ion implant. This is specially so when it is required that the spherical surfaces be ion implanted uniformly with substantially the same dose and to substantially the same depth about their entire spherical surfaces. Such requirements prevail in instances when the spherical workpieces are intended for use as ball bearings designed for exotic applications, as for instance in space or armaments including aircraft and ships. These specialized applications require ball bearings of all sizes and widely varied materials, including some of miniature sizes. The large scale uniform ion implantation of spherical workpieces of differing diameters and materials has been addressed with some success in a copending application Ser. No. 167,632, filed Mar. 11, 1988 and assigned to a common assignee, the Spire Corporation, the disclosure of which has been incorporated herein by reference.

In the process and apparatus disclosed and claimed in said copending application Ser. No. 167,632, filed Mar. 11, 1988, the spherical workpieces come in contact with, i.e., collide, at two points inside the ball cages during their ion implantation: once along the curved internal surface of the ball cage and, second when colliding with the conical bottom of the ball cage. Consequently, damage to the spherical workpieces due to collision has been higher than expected. Further, before each implantation run, both the fixture and the spherical workpieces must be thoroughly cleaned of contaminants for the ion implantation to be uniform. With the ball cages being only open at one end however, such cleaning has been cumbersome and time consuming, frequently involving using mechanical abrasion with swabs to ensure that no chemicals remain therein. The reason for the ball cages being only open at one end was based on a desire to facilitate the cooling of the fixtures during and subsequent to the ion implantation run. With the ball cages not penetrating through the disc, a back surface thereof with a larger area has been available to optimize heat transfer to and through a cooled base plate on which the disc is removably secured during ion implantation. This previous method also produced spherical workpieces which, at times, exhibited magnetization. These and other shortcomings of this previous method are addressed by the improved process and revised apparatus of the present invention.

The process of the invention essentially includes the steps of providing a revised fixture 10 designed to accommodate and present a plurality of spherical workpieces 12 to a large area ion beam 14, cleaning both the fixture 10 and the spherical workpieces 12 of contaminants, placing the cleaned workpieces 12 into the fixture 10, and exposing the plurality of spherical workpieces 12 to the wide area ion beam 14 for a predetermined period of time so as to ion implant each one of the plurality of spherical workpieces 12 over their respective entire spherical surfaces with substantially uniform ion doses and to substantially uniform depths, while simultaneously assurring that the spherical workpieces 12 themselves do not overheat. Such unwanted overheating of the spherical workpieces 12 would adversely affect their surface characteristics and could, if the overheating were excessive, actually defeat the very purpose of the inventive process, i.e., to improve their surface characteristics. As known, the temperature of the spherical workpieces 12 during their ion implantation is affected by the energy of the ion beam 14, by the current density of the ion beam 14, the size of the workpieces 12 and the design of the fixture 10. With decreasing sizes of the spherical workpieces 12, the current density must be correspondingly decreased as well. A decrease in the current density requires however that the implant time be increased accordingly.

In order to achieve better operative control of these process variables, a thermocouple 90 is operatively connected to the fixture 10 and constantly monitors its temperature, particularly during an ion implantation run.

Desired surface characteristics for the spherical workpieces 12 include, among others, enhanced surface hardness and enhanced resistance to chemical attack. The desired surface characteristics vary depending on the intended end use of the spherical workpieces 12 and are, of course, influenced, among others, by their sizes and/or the materials from which they were made. The specific composition of the ion beam 14, its ion current density, and all of the other implant parameters will, of necessity, be selected and be dictated by the specifications of the intended end use for the spherical workpieces 12 (i.e., the balls), their sizes and their materials. Preferably, the large area ion beam 14 is a broad electrostatically scanned beam, with uniformity over area from about 5"×5" to about 30"×30". Ion beam current densities range from about 0.5 uA/cm$^2$ to about 100 uA/cm$^2$.

Time duration of the ion implantation can range from about four hours to about one hundred hours. The preferred energy level of the ion implantation depends, among others, on the specific material of the spherical work pieces 12, and can range from about 10 keV to about 250 keV.

Figure 4:
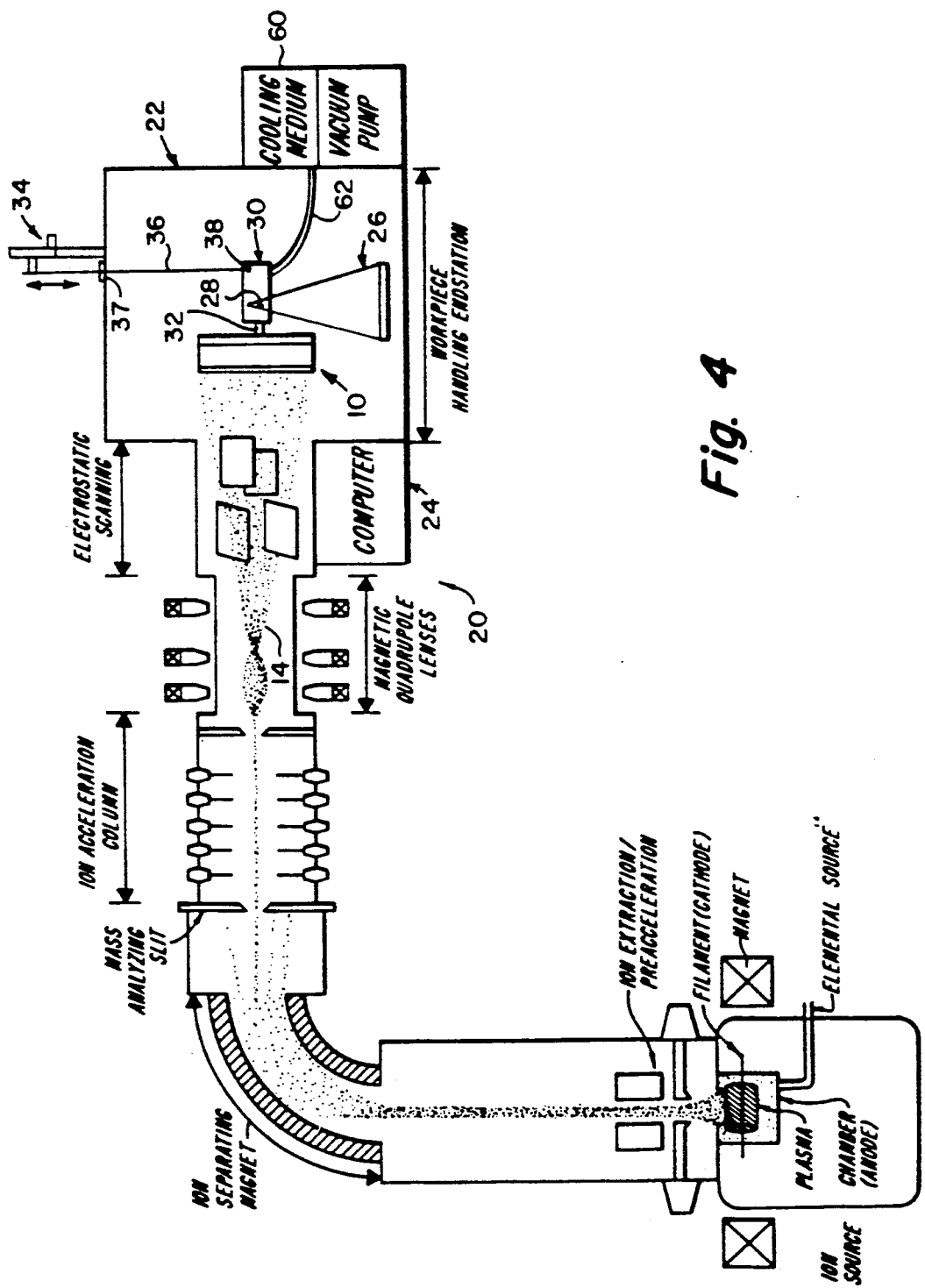
FIG. 4 is a schematic view of an ion beam implanter useful in practicing the process of the invention.

The apparatus for practicing the process of the invention essentially includes a suitable ion beam implanter 20, such as a Varian-Extrion 200 kV implanter, an Eaton-Nova implanter or a like instrument, illustrated in FIG. 4. This ion beam implanter 20 can be the same as, or an adaptation of the one illustrated in and described in said U.S. Pat. No. 4,693,760, assigned to the common assignee herein, the disclosure of which is incorporated herein by reference.

The ion beam implanter 20 is adapted to include a workpiece handling endstation 22, which serves as the implantation chamber, and a computer 24, as may be best observed in FIG. 4. The computer 24, which is operatively coupled to the thermocouple 90, allows for flexibility in the selection and adjustment of the operating parameters of the ion beam implanter 20, as required, and also for controlling the operation of the operative parts thereof, as monitored by the thermocouple 90.

Within the implantation chamber 22, the fixture 10 is shown mounted on a suitable base 26. The base 26 is provided with a pivot axis 28. The pivot axis 28 is designed rockingly to mount therein a first motor assembly 30 provided with a rotatable shaft 32. Shaft 32 in turn is designed to mount, for rotational displacement thereabout, the fixture 10. The rocking motion is imparted to the first motor assembly 30, and via its shaft 32 to the thereon mounted fixture 10, by a second linear motor drive assembly 34, preferably mounted outside of the implantation chamber 22. An appropriate linkage 36 is designed to transmit, through an appropriate feedthrough 37, a reciprocating linear motion from the second linear motor drive assembly 34 to an anchor 38 on the first motor assembly 30. It will be appreciated that the two axes of motion of the fixture 10 are normal to each other. One of the two axes is concentric with the longitudinal axis of the first motor assembly 30 as defined by its shaft 32, and the second of the two axes passes through the pivot axis 28, normal to the shaft 32.

The fixture 10 essentially comprises three elements: a member 40, preferably shaped as a disc and having a front surface 42 and a back surface 44; a combination cover plate and/or mask 46 removably fastened to the front surface 42 by a plurality of suitable fasteners 48 reaching into a plurality of tapped holes 50 formed in the surface 42; and a cooling plate 52 disposed on the back surface 44 and secured to the member 40. Preferably, the member 40 is secured to the cooling plate 52 by a plurality of studs (not shown) extending from the member 40 and designed to pass through a plurality of matching holes (not shown) formed in the cooling plate 52. A plurality of nuts (not shown) are mounted on the extended studs, clamping thereby the cooling plate 52 to the member 40. Alternatively, the plate 52 is being welded thereto.

Preferably, the shaft 32 is formed integrally with the cooling plate 52. Such a unitary construction is advantageous since it allows for the removal of the entire fixture 10 from within the implantation chamber 22 following the completion of the ion implanting process by simply dislodging the shaft 32 from the first motor assembly 30.

The shaft 32 is provided with an inlet channel 54 and an outlet channel 56, both communicating with a suitably shaped cooling channel 58 formed within the cooling plate 52 in parallel spaced relation to the back surface 44 of the disc-shaped member 40. The channels 54 and 56 formed in the shaft 32, in turn communicate with appropriate fixtures formed within the first motor assembly 30. Suitable cooling medium, such as deionized water, is contained in a suitable container 60 located outside the implantation chamber 22. A bilumen flexible hose 62, appropriately insulated, connects the container 60 with the fixtures formed within the first motor assembly 30 so as to allow for the continuous circulation of fresh cooling medium from the container 60 to the cooling channel 58 formed in the cooling plate 52 and back to the container 60. Preferably, both the disc-shaped member 40 and the cooling plate 52 are formed of metal. Preferred metals include stainless steel for the member 40, or a metal compatible with the material to be ion implanted. The cooling plate 52 is preferable made from aluminum or copper for good thermal transfer.

The disc-shaped member 40 is provided with a plurality of ball holes 64 formed in its front surface 42. The size and the number of these ball holes 64 formed in the member 40 will vary, depending on the diameters of the particular spherical workpieces 12 intended for ion implantation. As may be best observed in FIG. 2, the particular diameter of the ball holes 64, as indicated by an arrow 66, exceeds the particular diameter of the particular spherical workpieces 12 being ion implanted, as indicated by a second arrow 68. This is important so as to allow the spherical workpieces 12 (i.e., the balls) freedom to move within the ball holes 64. Such movement of the spherical workpieces 12 involves not only the free rotation of the balls about their respective axes when within the holes 64, but also, and just as importantly, the movement of the balls from a backward position 65, indicated in phantom lines, to a forward position 67, indicated is solid lines. Preferably, the depth of the ball holes 64 is about one and one-half times the diameter 68 of the particular spherical workpieces 12.

The bottoms of the ball holes 64 are now formed with spherical surfaces 84 by being cut with a ball end mill. As a result, there is now less likelihood of damage occurring to the spherical workpieces 12 since there is no longer any second collision with the previous conical surface as the workpieces 12 roll to the back of the holes 64. Since the workpieces 12 are now in contact with the inside of the holes 64 at one point only, the workpieces 12 can spin more effectively, achieving thus an even more uniform implantation of their surfaces.

Care must be exercised that the inside surfaces of the ball holes 64 be machined to be as smooth as possible throughout. Since the balls being implanted are intended to move within the holes 64, any high points existing on the inside walls of the ball holes 64 could damage the balls.

It is one of the functions of the combination cover plate and/or mask 46, when secured onto the front surface 42 of the member 40, to contain the spherical workpieces 12 within their respective ball holes 64. In order to achieve this function, the combination cover plate and/or mask 46 can comprise a plate 70 by itself, in which case the plate 70 also functions as the mask. In the alternative, the combination can also include a mask 72. The need for a separate mask will be more fully evident from the description below. Both the plate 70, and the mask 72 in instances where one is used, are provided with a plurality of apertures 74 and 76, respectively. The diameters of the respective apertures 74 and 76 are indicated by arrows 73 and 75. Each of these plurality of apertures 74 and 76 is formed concentric with the plurality of holes 64 formed in the disc-shaped member 40. So as to function to contain the spherical workpieces 12 within their respective ball holes 64, both the apertures 74 and the apertures 76 must be smaller in their diameters 73 and 75 than the particular diameter of the particular spherical workpieces 12 being ion implanted.

Figure 2:
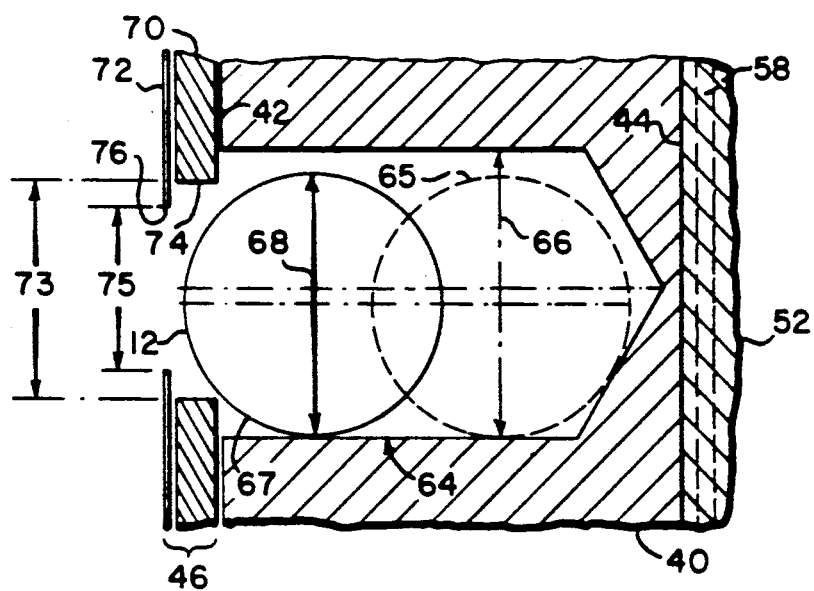
FIG. 2 is a fragmentary section, on an enlarged scale, of a portion of the revised fixture illustrated in FIG. 1.

It is pointed out that the combination cover plate and/or mask 46, even in instances when it is made up of both the plate 70 and the separate mask 72, is so formed and constructed that it can be fastened onto the front surface 42 of the member 40 with either of its parallel spaced surfaces facing the surface 42. Thus, when the separate mask 72 is used, the mask 72 can be located on the outside, as illustrated in FIG. 2, or the mask 72 can be located in between the plate 70 and the front surface 42 of the member 40, depending on the particular operating conditions now being described. Further, when the separate mask 72 is used, it preferably is permanently attached to and united with the plate 70, as for instance by being welded or otherwise secured thereto. Further, when the separate mask 72 is used, its apertures 76 must have diameters 75 which are either identical with the diameters 73 of the apertures 74 or are smaller than the apertures 74. Consequently, the diameters 75 of the apertures 76 cannot exceed the diameters 73 of the apertures 74.

For most applications, the combination cover plate and/or mask 46 can comprise simply the plate 70. This is so since the second function thereof is that of a mask defining the angle of incidence of the ion beam 14 on the spherical workpieces 12. This angle of incidence of the ion beam 14 on the spherical workpieces 12 must be within about 45° of normal incidence in order to minimize loss of material due to sputtering.

There are instances, however, when the combination cover plate and/or mask 46 must include both the plate 70 and the mask 72, although preferably constructed and mounted as a unit, as mentioned. These instances include a situation when the material comprising the spherical workpieces 12 intended to be ion implanted is not compatible with the material comprising the plate 70. Another instance involves a situation where the diameter 66 of the ball holes 64 is already very small indeed due to the miniature sizes of the spherical workpieces 12 being ion implanted. The mask 72 always is formed thin, especially when compared to the thickness of the plate 70.

Figure 3:
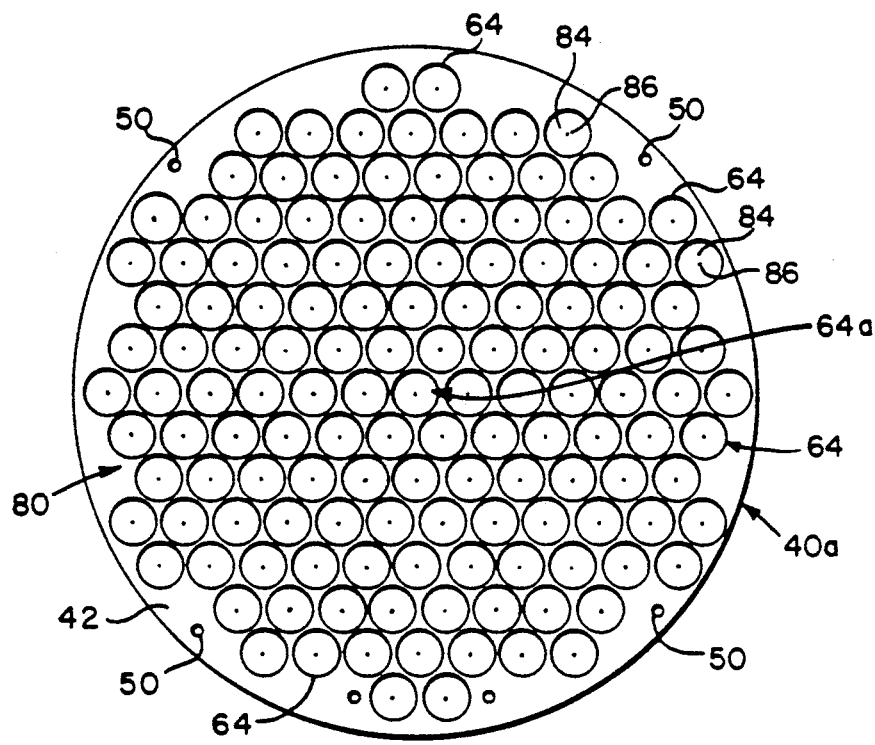
FIG. 3 is a plan view along the line 3—3 and on an enlarged scale, of the revised fixture illustrated in FIG. 1.

In FIG. 3 is illustrated in plan view, a disc-shaped member 40a designed to ion implant small-diameter spherical workpieces 12. The ball holes 64 formed in the front surface 42 of the disc-shaped member 40 are illustrated as arranged in a hexagonal pattern 80 for maximum packing and a most efficient use of the wide area ion beam 14. This hexagonal pattern 80 is characterized by having the central ball hole 64a surrounded by six rows of holes 64 radiating in six directions, like spokes of a wheel.

Preferably, the disc-shaped member 40, the cooling plate 52 and the cover plate 70 are formed of metal, such as stainless steel. The thin mask 72, when one is used, also is made of metal, but preferably a non-sputtering metal, such as tantalum, and the like.

In practicing the process of the invention, it is important first to clean the fixture 10 and the spherical workpieces 12 to be ion implanted of all surface contamination. The spherical workpieces 12 preferably are cleaned is suitable solvent baths, including 1,1,1-trichloroethylane and methanol. In order to facilitate the cleaning of the fixture 10, each of the ball holes 64 is further provided with a cleaning orifice 86 concentric with its new spherical bottom 84. The orifice 86 effects communication with the back surface 44 of the disc-shaped member. As a result, when the fixture 10 on its first use for the day is first cleaned, the use of mechanical abrasion with swabs, why still necessary, is no longer the only feature relied on to ensure that no debris and contaminants remain in the ball holes 64 from any prior use. The cleaning orifice 86 now permits the cleansing solvent to drain therethrough, removing any residue of debris in a simplified, less expensive manner. Then the fixture 10 is mounted empty, i.e., with no spherical workpieces 12 therein, into the workpiece handling endstation 22 and is subjected therein to bombardment by an ion beam 14, preferably including argon or nitrogen.

As mentioned, before any ion implantation run, both the fixture 10 and the spherical workpieces 12 preferably are degaussed to remove any potential magnetization therefrom. As known, degaussing, also known as deperming, is a method of neutralizing, i.e., demagnetizing, a magnetic field surrounding an item, herein the fixture 10 and the spherical workpieces 12. Degaussing of both preferably is effected with the aid of a 15 inch diameter degaussing coil, which is a plastic-encased coil that can be plugged into a conventional 120 VAC outlet and moved slowly forward and away from the fixture 10 and the spherical workpieces 12.

Immediately thereafter, the spherical workpieces 12 are loaded into their ball holes 64, the appropriate combination cover plate and/or mask 46 is secured onto the front surface 42 of the disc-shaped member 40, and the workpiece handling endstation 22 is pumped down to the desired level of vacuum. The cooling medium in container 60 is caused to flow to the fixture 10 and the first and second motor assemblies 30 and 34 are rendered operational, preferably under the control of the computer 24. The computer 24 also is designed to control all of the operational parameters of the ion beam implanter 20, including the thermocouple 90 and the ion beam 14 current density. Typically, the current density is about 2.5 microamperes per $cm^2$ at 120 keV for hardened tool steels. A Faraday cup is used to monitor the beam current density. The current density determines the dose. A current integrator also is preferably employed to signal when the desired dose of ions is achieved.

Preferably under the operational control of the computer 24, the first and second motor assemblies 30 and 34 begin to move the fixture 10 in their respective two axes of motion. Specifically, the first motor assembly 30 begins to rotate the fixture 10, with a preferred rpm of from about 0.5 to about 2 rpm, depending on the size and material of the spherical workpieces 12 to be ion implanted. Simultaneously therewith, the second motor drive assembly 34 begins to rock the fixture 10 about the pivot axis 28 so as to tilt alternately the top or the bottom of the fixture 10, as shown in FIG. 4, into or away from the incoming wide area ion beam 14.

With the fixture 10 both spinning and rocking back and forth simultaneously, the therein contained spherical workpieces 12 also rotate and move back and forth, being alternately in front of the ball holes 64, shown in solid line in FIG. 2, or being alternately in the back of the ball holes 64, shown in phantom line in FIG. 2. Preferably, the forward tilt or angle about the pivot axis 28 is about 10° and the backward tilt or angle is about 3°. Consequently, the spherical workpieces 12 spend most of their time in the forward position in their respective ball holes 64, i.e., about 75% to about 80% of the ion implantation time. Typically, one tilt cycle runs for about 100 seconds. Tilt cycles can vary from about 50 seconds to about 300 seconds.

The specific ion implantation time depends, among others, on the size and material of the spherical workpieces 12 and the implant dose. The specific depth of ion implantation is dictated, for the most part, by the energy of the ion beam and the composition and density of the implanted material. For most applications, the desired depth of ion implantation is less than one micrometer, and preferably is from about 0.05 to about 0.50 micrometer.

During the ion implantation process, the wide area ion beam 14 preferably, although not necessarily, is kept at the selected ion beam current density. Also preferably, the wide area ion beam 14 is kept on at the selected density during the entire implantation process. When ion implanting certain sizes and/or materials however, it may be desirable to expose these spherical workpieces 12 to the ion beam 14 only when they are in their forwardly tilted position and shutting off the ion beam 14 when the spherical workpieces 12 find themselves in the back of their holes 64. This is effected by shutting off the linear motor drive assembly 34 when the fixture is tilted forward and while the spherical workpieces 12 are in their forward positions 67. By so doing, the spherical workpieces 12 will spend about 90% to about 95% of their implant time in the forward position.

In order to assure that the spherical workpieces 12 receive a uniform dose of ions over their respective entire spherical surfaces during their implantation, a randomization step is programmed into the computer 24. This randomization step works as follows. At specific intervals, i.e., once every 90 to about 120 seconds, the second linear motor drive assembly 34 is stopped by the computer 24, for about 15 to about 30 seconds, while at the same time the first motor drive assembly 30 continues rotating the fixture 10, preferably at about one r.p.m. This assures that the forward/backward movement of the spherical workpieces 12 does not occur at the same angle of rotation of the first motor drive assembly 30. Thus, synchronization of the two motor drive assemblies 30 and 34, which would cause non-uniform implantation, is prevented.

EXAMPLE I

Spherical workpieces 12 formed of 440 C stainless steel, and 52100 steel, with diameter sizes of 7/16", ½", and 13/16" were ion implanted in the ion implanter 20, with the following implant parameters:
Ion beam current density: 2.53 uA/cm$^2$
Time duration of ion implantation: 42 hours
Ion species employed: Ti and C
Ion beam on at all times.
Energy of ion implantation: Ti—120 keV; C—60 keV
Maximum temperature of the workpieces 12: 120° C.
Ion dose on workpieces 12: Ti—2×10$^{17}$ ions/cm$^2$
 C—1×10$^{17}$ ions/cm$^2$
Ion dose on fixture 10: Ti—16×10$^{17}$ ions/cm$^2$
 C—8×10$^{17}$ ions/cm$^2$
Geometry factor: 8

The geometry factor is selected, taking into account the diameter 75 of the aperture 76 in the mask 72 and the ratio of the diameter 75 of the aperture 76 to the diameter 68 of the spherical workpiece 12. At any one point in time during the ion implantation, 1/xth of the surface of the spherical workpiece 12 is exposed to the ion beam 14. Consequently, the planar surface of the fixture 10 was exposed with an ion dose multiplied by x so as to ensure that the surface of the spherical workpiece 12 does receive the proper ion implant dose. In most instances, a geometry factor of 8 was chosen. A geometry factor of 8 corresponds to an angle of incidence of the ion beam 14 on the surface of the spherical workpiece 12 of about 45°. A mask 72 with smaller diameter 75 apertures 76 which provides an angle of incidence of the beam 14 on the workpiece 12 of only about 30° will require a geometry factor of 16.

EXAMPLE II

Spherical workpieces 12 formed of 52100 and 440 C stainless steel, with diameter sizes of 0.047" and 0.156", were ion implanted in the ion implanter 20, with the following implant parameters:
Ion beam current density: 1.14 uA/cm$^2$
Time duration of ion implantation: 90 hours
Ion species employed: Ti and C
Ion beam on at all times.
Energy of ion implantation: Ti—120 keV; C—60 keV
Maximum temperature of the workpieces 12: 120° C.
Ion dose on workpieces 12: Ti—2×10$^{17}$ ions/cm$^2$
 C—1×10$^{17}$ ions/cm$^2$
Ion dose on fixture 10: Ti×16×10$^{17}$ ions/cm$^2$
 C—8×10$^{17}$ ions/cm$^2$
Geometry factor: 8

EXAMPLE III

Spherical workpieces 12 formed of 440 C stainless steel, with diameter sizes of 0.875", were ion implanted in the ion implanter 20, with the following implant parameters:
Ion beam current density: 2.53 uA/cm$^2$
Time duration of ion implantation: 20 hours
Ion species employed Ta
Ion beam on at all times.
Energy of ion implantation: Ta—120 keV
Maximum temperature of the workpieces 12: 120° C.
Ion dose on workpieces 12: Ta—1×10$^{17}$ ions/cm$^2$
Ion dose on fixture 10: Ta—16×10$^{17}$ ions/cm$^2$
Geometry factor: 8

EXAMPLE IV

Spherical workpieces 12 formed of silicon nitride (Si$_3$N$_4$) with ½" diameter sizes were ion implanted in the ion implanter 20, with the following implant parameters:
Ion beam current density: 4.00 uA/cm$^2$
Time duration of ion implantation: about 25 hours
Ion species employed: Nickel
Ion beam on at all times.
Energy of ion implantation: 120 keV
Maximum temperature of the workpieces 12: about 300° C.
Ion dose on workpieces 12: —2×10$^{17}$ ions/cm$^2$
Ion dose on fixture 10: —16×10$^{17}$ ions/cm$^2$
Geometry factor: 8

Figure 5:
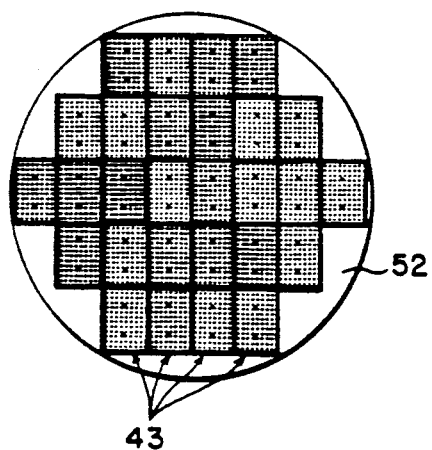
FIG. 5 is a plan view of an alternate fixture designed to present a plurality of miniature spherical workpieces to an ion beam according to the invention.
Figure 6:
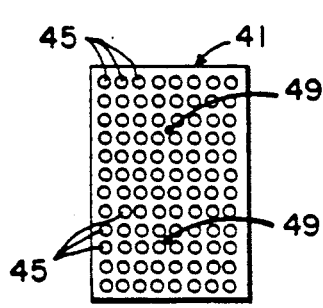
FIG. 6 is a plan view of one operative part of the fixture shown in FIG. 5 but on an enlarged scale.
Figure 7:
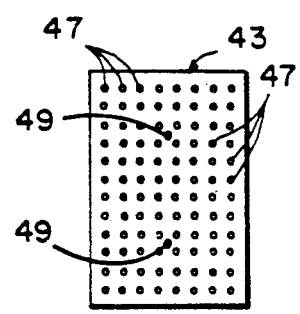
FIG. 7 is a plan view of another operative part of the fixture shown in FIG. 5, also on an enlarged scale.

When ion implanting spherical workpieces 12 that are of micro-miniature sizes, i.e., from about 0.032" to about 0.156", a plurality of individual plates 41, each provided with its own individual cover 43, is used in lieu of the disc member 40, note FIGS. 5, 6 and 7. Each of these plurality of plates 41 is provided with a plurality of ball cages 45 to accommodate loosely therein the miniature spherical workpieces. 12. Corresponding and superimposed holes 47 are formed in the respective covers 43, designed both to contain the spherical workpieces 12 within their ball cages 45 and also to expose the workpieces 12 to the ion beam 14. Each plate 41 is machined with ball cages 45 numbering from about 200 to about 2000 per plate 41, depending on their sizes. Each plate 41 can vary in size from about 2"×4" to about 4"×8". The plates 41 and their respective covers 43 are conveniently secured both to each other and to the cooling plate 52 by suitable fasteners 49.

Thus it has been shown and described a method and an apparatus for the ion implantation of spherical workpieces 12, which method and apparatus satisfy the objects and advantages set forth above.

Since certain changes may be made in the present disclosure without departing from the scope of the present invention, it is intended that all matter described in the foregoing specification or shown in the accompanying drawings, be interpreted in an illustrative and not in a limiting sense.

What is claimed is:
1. A method for the ion implantation of spherical workpieces comprising:
 (a) providing a fixture accommodating and presenting a plurality of spherical workpieces to an ion beam, said fixture provided with a plurality of ball holes having spherical bottoms provided with an orifice, said holes loosely to contain said plurality of said workpieces;
 (b) cleaning said fixture of contaminants;
 (c) providing a plurality of spherical workpieces intended to be ion implanted;

(d) cleaning said plurality of spherical workpieces of contaminants;
(e) placing said plurality of spherical workpieces into said plurality of ball holes of said fixture;
(f) exposing each of said plurality of spherical workpieces uniformly and at substantially normal incidence to said ion beam so as to ion implant the same to a uniform predetermined depth and dose;
(g) wherein said fixture both rotates said plurality of spherical workpieces about their respective axes and also rocks them back and forth while exposing them to said ion beam.
(h) said cleaning step including exposing both said fixture and said spherical workpieces to degaussing to demagnetize the same; and
(i) wherein said rocking of said spherical workpieces is periodically interrupted for a predetermined period of time to effect randomization of said ion implantation so as to achieve uniformity in ion implantation.

2. The method of claim 1 wherein said predetermined period of time in said randomization is about 15 to about 30 seconds once every 90 to about 120 seconds.

3. The method of claim 1 wherein said spherical bottoms of said plurality of ball holes are formed with a ball end mill and polished to eliminate imperfections therein.

4. The method of claim 1 wherein the current density of said ion beam is between about 0.5 to about 100 microamperes/$cm^2$ at an energy level ranging from about 10 to about 250 keV, and said exposing said workpieces to said ion beam is for a time period from about 4 to about 100 hours.

* * * * *